United States Patent
Adams et al.

(10) Patent No.: US 7,695,766 B2
(45) Date of Patent: Apr. 13, 2010

(54) METHOD OF IDENTIFYING SPECIFIC HOLES IN AN INTERFACE GUIDING PLATE

(75) Inventors: Neil Adams, Maple Grove, MN (US); Stuart Eickhoff, Plymouth, MN (US); Jon Hample, Plymouth, MN (US)

(73) Assignee: Circuit Check, Maple Grove, MN (US)

( * ) Notice: Subject to any disclaimer, the term of this patent is extended or adjusted under 35 U.S.C. 154(b) by 372 days.

(21) Appl. No.: 11/732,087

(22) Filed: Apr. 2, 2007

(65) Prior Publication Data

US 2008/0231299 A1    Sep. 25, 2008

Related U.S. Application Data

(62) Division of application No. 10/867,164, filed on Jun. 14, 2004, now Pat. No. 7,200,509.

(60) Provisional application No. 60/572,263, filed on May 18, 2004, provisional application No. 60/572,315, filed on May 18, 2004.

(51) Int. Cl.
*B05D 3/00* (2006.01)

(52) U.S. Cl. .................. 427/271; 439/92; 439/101; 439/108; 439/931

(58) Field of Classification Search .............. 427/271; 439/92, 101, 108, 608, 931
See application file for complete search history.

(56) References Cited

U.S. PATENT DOCUMENTS

| | | | |
|---|---|---|---|
| 3,296,099 A | * | 1/1967 | Dinella .................. 205/126 |
| 5,527,189 A | * | 6/1996 | Middlehurst et al. ... 439/607.14 |
| 6,535,008 B1 | | 3/2003 | Casale |
| 6,771,090 B2 | | 8/2004 | Harris et al. |

OTHER PUBLICATIONS

Declaration of Neil Adams, 2 pages.
U.S. Appl. No. 60/572,263 for Neil Adams, et al. entitled "Vacuum Chamber With Two-Stage Longitudinal Translation for Circuit Board Testers", filed May 18, 2004.
U.S. Appl. No. 60/572,315 for Scott Staggert entitled "Plate With Coating for Visually Discerning Among Pre-Identified Holes", filed May 18, 2004.

(Continued)

*Primary Examiner*—Michael Kornakov
*Assistant Examiner*—Xiao Zhao
(74) *Attorney, Agent, or Firm*—Altera Law Group, LLC

(57) ABSTRACT

A circuit board tester that uses a dual-stage translation to bring a unit under test (UUT) into physical and electric contact first with a series of tall probes, then with a series of short probes. Initially, the UUT is mounted on a support plate, and spaced apart from both the tall and short probes. First, in order to perform a functional test on the UUT, a first vacuum stage is engaged, and atmospheric pressure translates the UUT longitudinally until contact is made with a first hard stop, defining a first position. At this first position, the UUT is in contact with a series of tall probes, and is spaced apart from a series of short probes. After a function test is performed, a second vacuum stage is engaged in addition to, and independent of, the first vacuum stage. Atmospheric pressure translates the UUT longitudinally until contact is made with a second hard stop, defining a second position.

14 Claims, 6 Drawing Sheets

OTHER PUBLICATIONS

U.S. Appl. No. 10/867,164 for Neil Adams, et al. entitled "Vacuum Chamber With Two-Stage Longitudinal Translation for Circuit Board Testing", filed Jun. 14, 2004.

Office Action dated Oct. 18, 2005 from U.S. Appl. No. 10/186,7164, now issued patent No. 7200509 and dated Apr. 3, 2007.

Office Action (Notice of Non-Compliant) dated Jun. 30, 2006 from U.S. Appl. No. 10/867,164, now issued patent No. 7200509 and dated Apr. 3, 2007.

Office Action (Restriction Requirement) dated Sep. 28, 2006 from U.S. Appl. No. 10/867,164, now issued patent No. 7200509 and dated Apr. 3, 2007.

Notice of Allowance dated Nov. 20, 2006 from U.S. Appl. No. 10/867,164, now issued patent No. 7200509 and dated Apr. 3, 2007.

* cited by examiner

METHOD OF IDENTIFYING SPECIFIC HOLES IN AN INTERFACE GUIDING PLATE

CROSS-REFERENCE TO RELATED APPLICATIONS

The patent application is a divisional and claims the benefit of U.S. application Ser. No. 10/867,164 filed Jun. 14, 2004, now U.S. Pat. No. 7,200,509, in the name of Adams, et al. and entitled "Vacuum Chamber With Two-Stage Longitudinal Translation for Circuit Board Testing", which hereby is incorporated herein in its entirety by reference thereto; and further claims the benefit of U.S. Provisional Patent Application Ser. No. 60/572,263 filed May 18, 2004 in the name of Adams, et al. and entitled "Vacuum Chamber With Two-Stage Longitudinal Translation for Circuit Board Testers", which hereby is incorporated herein in its entirety by reference thereto; and further claims the benefit of U.S. Provisional Patent Application Ser. No. 60/572,315, filed May 18, 2004 in the name of Staggert and entitled "Plate With Coating for Visually Discerning Among Pre-Identified Holes", which hereby is incorporated herein in its entirety by reference thereto.

STATEMENT REGARDING FEDERALLY SPONSORED RESEARCH OR DEVELOPMENT

Not Applicable

BACKGROUND OF THE INVENTION

1. Field of the Invention

This invention is directed to test equipment, and more particularly to test equipment for circuit boards.

2. Description of the Related Art

Circuit board testers are used for testing a variety of circuit boards or similar devices to assure that the circuit boards operate as intended. In at least one type of circuit board tester, such as Agilent Model No. 3070, Series 3, a separate device, referred to as a fixture, is used to position the circuit board such that a plurality of electrically conductive probes (which are part of, or coupled to, the tester) contact predetermined components or positions of the circuit board. The particular components or positions that are contacted by the test or probes depend on the tests that are desired. When the probes are in contact with the desired locations on the circuit board, electrical signals with predetermined parameters (e.g., predetermined magnitudes or patterns of current, voltage frequency, phase and the like) are applied by the tester, typically under control of a computer, to certain of the probes. Some or all of the probes are used to measure the performance or response of the circuit board (i.e., to measure electrical parameters at some or all of the probes contacting the circuit board). In this way, it is possible to rapidly perform a number of tests or measurements characterizing the performance of the circuit board while simulating the conditions the circuit board would have, or could have, during actual use. Although it is possible to use these types of tests (and testing devices) for a variety of possible purposes (such as "spot checking" selected circuit boards at a production facility, testing circuit boards which may be malfunctioning, testing prototype circuit boards as part of a design program and the like), in at least some applications, circuit board testing is used to provide quality assurance on all or substantially all products of a given type or class which are produced by a company. Even with the relatively rapid test procedures which can be achieved by in circuit testing, it is not unusual for desired testing of each circuit board to require on the order of 30 seconds to 90 seconds or more.

Because, in at least some applications, circuit board testing is performed on substantially all devices on a production line or production facility, speed and reliability of testing can be especially important since delay or failure at a testing station can delay or interrupt the overall production in a production line or facility. Accordingly, it would be useful to provide a fixture, useable in connection with in-circuit testers, which provides desired speed of positioning the circuit board or other unit under test (UUT) and which achieves a relatively high degree of reliability, e.g., so as to avoid interrupting or delaying production rates at a production line or facility.

The effect of such testing on overall production rates is at least partially related to the rate at which each UUT can be placed in the fixture and the rate at which the fixture can accurately and reliably move the UUT to the desired position or positions. In at least some situations, it is desired to provide a tester with probes at two or more levels (with respect to a direction normal to the plane of the UUT) e.g., by providing some probes having a first height and other probes having a second height. This arrangement affords the opportunity to perform two or more different sets of tests such that the points at which probes contact the UUT during one set of tests are different from (or a subset of) the points at which probes contact the UUT during another set of tests. Typically, in such a "dual stage" testing situation, the UUT is first positioned so as to contact all probes (and perform a first set of tests), and then positioned to contact only the taller set of probes (at points of the UUT which are determined by the location of the tall probes) and a second set of tests are performed using only the taller probes. The order of the tests may be reversed, so that the taller probes contact first, then the shorter probes contact. Although many different testing procedures can be used, as will be understood by those of skill in the art, in at least some situations, the taller probes may be used for functional tests and/or boundary scan tests (such as boundary scan tests as described in IEEE Standard No. 1149.1).

In at least one previous approach, the circuit board is moved in the direction of the probes, typically causing the taller probes, which may be provided with a spring-urged telescoping structure, to partially collapse or telescope, down to the level of the smaller probes, such that substantially both sets of probes (the taller probes and the shorter probes) contact the UUT at desired positions. With the board held in this position, a first set of tests (such as functional tests and/or boundary scan tests) can be performed. After tests are performed using the full set of probes the vacuum is released such that the UUT is positioned to contact only the taller probes (which telescope upwardly) and a second set of tests, (such as tests directed to measuring performance or characteristics of individual components on the UUT) can be performed.

In order for fixtures used in dual stage testing to operate well, especially in the context of a production line or facility, it is also desirable to avoid delays or malfunctions in moving the UUT between the stages. Accordingly, it would be desirable to provide a fixture, useable connection with dual stage in-circuit testing, with a relatively high degree of reliability and operating speed.

In at least one type of fixture, the force of atmospheric pressure is used to move the UUT towards the probes, e.g., by drawing a (partial) vacuum in a sealed area above or near the probes. In these devices, in order to accommodate dual stage testing, such fixtures have, in the past, been provided with a shuttle plate positioned in the area somewhere above the probes and defining one or more standoff structures which engage or contact a surface of the fixture (or of the UUT) to limit the amount of downward movement that the vacuum can effect on the UUT. In this way, the shuttle plate, in a first position, can cause the UUT to be positioned so as to contact only the taller probes. After a first set of tests is performed, the vacuum is at least partially released and the shuttle plate is then moved, typically laterally, such that the standoffs slide against a surface of the fixture sufficiently to become aligned with notches or other openings, allowing the (reapplied) vacuum to pull the UUT down farther, so as to contact the full set of probes (so that a second set of tests can be performed). It is also possible to perform tests with the full set of probes before performing the tests using only the taller probes. In at least one previous device, a shuttle mechanism is located in the lid structure to hold the board down onto the long probes. This device requires pneumatic cylinders, and requires an additional operator connection of compressed air lines to the fixture.

While this arrangement can achieve dual stage positioning, it has been found that such a shuttle plate approach can lead to delays or failures in testing. For example, the shuttle plate approach can provide a relatively high amount of friction when the shuttle plate is moved laterally, particularly when components of the fixture are made of a G10 or similar relatively high-friction material. This can lead to binding (inability of the shuttle plate to move smoothly to the second position or return to the first position). Such binding can not only cause delays and slow down a production line or production facility but can cause failures which may require repairs or replacement of parts, thus creating a substantial interruption of production. Accordingly, it would be useful to provide a fixture that can achieve dual stage testing while avoiding the type of binding, delay, failure, or interruption associated with the use of a shuttle plate.

In at least some systems, pneumatic actuators are used to move the UUT towards the probes. In these types of systems, the pneumatic actuators are configured and/or controlled so as to be movable among three positions, an initial position, a position with the UUT in contact with the taller probes and a position with the UUT in contact with all probes. Pneumatic systems, unfortunately, are associated with certain undesirable qualities. Unlike an atmospheric pressure system, which provides pressure spread over a substantial area, preferably over substantially the entire surface of the UUT, pneumatic systems generally provide pressure only at discrete locations. In general, this leads to a certain amount of flexure of the UUT as it is moved by the pneumatic actuators which can lead to poor contact with the probes in some locations of the UUT and, thus, inaccurate test results. Furthermore, pneumatic systems are generally relatively massive (e.g., such as resulting in fixtures weighing 40 to 50 pounds more than vacuum systems). Generally, this means that changing from one fixture to another (such as for routine maintenance, or to accomplish testing of a different type of UUT) will require two or more workers and/or lifting or positioning equipment, and will typically require more time than changing fixtures in a vacuum system, thus, leading to delays and/or interruptions in a production line or production facility. This is particularly true when the fixture is reinforced in an attempt to reduce the amount of flexure associated with pneumatic systems (although such reinforcement is, typically, only partially successful such that even reinforced systems may have an undesirable amount of flexure). Accordingly, it would be useful to provide a fixture which can be used for dual stage in-circuit testing which has a relatively low weight, e.g., compared with pneumatic-type fixtures, and/or imparts relatively little flexing on the UUT (e.g., compared with pneumatic-type fixtures), and otherwise achieves a low amount or probability of delays or interruptions.

In a prior art system disclosed in U.S. Pat. No. 6,535,008, the UUT, typically supported on a support plate that has perforations corresponding to the probe positions, is held spaced from all of the probes, e.g., by one or more springs. The prior art disclosure uses atmospheric pressure (by drawing a vacuum in the region adjacent the probes) to move the UUT (against one urging of the springs) into a position contacting all of the probes (i.e., both the short probes and the long probes). Such use of atmospheric pressure as a moving force reduces or substantially eliminates flexing of the UUT. In one aspect, in order to move the UUT to a second position, contacting only the tall probes, the vacuum is substantially released but a (preferably actuateable and/or controllable) structure limits the distance the UUT can travel away from the probes (under urging of the springs) so as to position the UUT at the desired location, contacting only the tall probes. Because this movement of the prior art system does not require the lateral sliding of a shuttle plate (or its components), e.g., against a high-friction surface and/or because this movement does not require relative sliding or other contact movement while components are pressed together by atmospheric pressure forces (since the vacuum has already been released, at least partially), there is relatively little tendency for binding during such movement and thus dual stage testing can be achieved with relatively low incidence or probability of delay or failure.

Stated another way, the prior art system of U.S. Pat. No. 6,535,008 uses a retractable arm that, when engaged into a slot, functions as a hard stop to longitudinal motion of the UUT with respect to the probes. At one end of the slot, the UUT is brought into contact with the tall probes, and at the other end, the UUT is brought into contact with the short probes. Any longitudinal motion of the UUT is accomplished by a single stage, driven by a single vacuum feed, and the extent of any longitudinal motion during testing is limited by the engaged retractable arm.

A potential drawback of the prior art system of U.S. Pat. No. 6,535,008 is that it still uses a translatable arm, which increases the complexity of the circuit tester system, and is subject to wear. Accordingly, it would be useful to provide a fixture which can be used for dual stage in-circuit testing which has a relatively low weight, e.g., compared with pneumatic-type fixtures, and/or imparts relatively little flexing on the UUT (e.g., compared with pneumatic-type fixtures), increases reliability by removing any laterally translatable parts, and otherwise achieves a low amount or probability of delays or interruptions.

The testers generally contain a plate as part of the tester that functions as a mechanical stand-off for the fixture. While the fixture is held rigidly in place against the plate, or against rigid stand-offs fastened to the plate, the probes make contact with the circuit board through various holes in the plate. The plates are usually supplied by the tester manufacturer with regularly spaced holes, usually in a rectangular grid, so that a given plate from the tester manufacturer may be used to test a variety of circuits. Even though a circuit generally requires its own custom layout for the probe locations, the plate, because of its standardized hole configuration, may be used relatively independently of the specific locations of the probes, and may also be reused when the tester is reconfigured to test a new circuit. This standardization of the hole locations reduces the number of custom parts required for a tester, and thereby reduces the cost of the system.

The plates are typically molded from a plastic material, such as polycarbonate, so that the array of holes may be built right into the mold. Because they are molded, not drilled, there is no additional cost required for drilling the holes. In addition, the resulting plastic part is non-conducting, which is important for insulation of the electrically conductive probes from each other. These plates are commercially available, and a model that fits the above-mentioned Agilent circuit tester is sold as the "3070 alignment plate".

A potential drawback to a completely standardized plate is that it generally requires considerable effort to identify particular holes during the final inspection of the tester prior to usage. Typically, a technician will have to verify the location of each probe manually, by counting the row and column values of each probe (seen visually through a hole in the plate), then comparing the values to those in a published list as part of the tester layout drawings. If there are dozens of probes, all specifically located in a rectangular array that contains hundreds of identical-looking holes, this may be a very time-consuming procedure for the technician, and may lead to errors in probe placement if the technician counts incorrectly. Accordingly, it would be useful to provide a plate with simple identification features, so that a technician may readily visually identify which holes are to accept probes.

One prior art solution is to manually mark each hole in the plate that will receive a probe during operation. This solution turns out to be simple in theory, but very labor-intensive, and therefore very expensive. Accordingly, it would be useful to provide a plate with simple identification features that may be identified using the same tools that provide the tester configuration drawings (reducing the possibility of human error in determining the locations.) Additionally, the identification features should be inexpensive, and not require a custom-fabricated plate for each particular circuit under test.

BRIEF SUMMARY OF THE INVENTION

The present embodiment uses a dual-stage translation to bring a unit under test (UUT) into physical and electric contact first with a series of tall probes, then with a series of short probes.

Initially, the UUT is mounted on a support plate, and spaced apart from both the tall and short probes. First, in order to perform a functional test on the UUT, a first vacuum stage is engaged, and atmospheric pressure translates the UUT longitudinally until contact is made with a first hard stop, defining a first position. At this first position, the UUT is in contact with a series of tall probes, and is spaced apart from a series of short probes. After a function test is performed, a second vacuum stage is engaged in addition to, and independent of, the first vacuum stage. Atmospheric pressure translates the UUT longitudinally until contact is made with a second hard stop, defining a second position. At this second position, the UUT is in contact with both tall and short probes (the tall probes being appropriately spring-loaded so as to maintain physical and electric contact with the UUT without damaging the UUT). After an in-circuit test is performed, both vacuum stages are released, and the UUT returns to its initial location, spaced apart from both the tall and short probes. The UUT may be replaced with another part to be tested, and the cycle is repeated.

A further embodiment has a plate with identification features, so that a subset of holes in the plate may be visually identified. A first side of the plate, preferably (although not necessarily) the side facing the fixture and circuit board during operation of the tester, is coated with a thin layer of paint at the factory, so that the area in between all the holes is generally uniformly coated. The paint is preferably colored in contrast to the unpainted color of the plate. A subset of the holes is identified, and the paint surrounding each hole in the subset is removed.

Typically, when a tester is customized to test a particular circuit, a set of drawings is made by a computer assisted drawing (CAD) machine, well-known in the art, and presented to a technician. The technician uses the drawings to configure the tester, and the drawings typically indicate the locations and types of the probes. Alternatively, the CAD machine may generate an automated set of instructions for placement of the probes during assembly of the tester. In the present invention, the CAD machine may generate an additional set of instructions for denoting which holes in the plate are to receive probes. The additional instructions may be used by an automated drilling machine that scrapes off the paint in the area surrounding each hole that receives a probe. The drilling machine uses a drill bit of a larger diameter than the hole, and only drills until the paint is removed; it does not drill substantially into the plate itself and does not increase the diameter of the hole. Once the paint is removed around a particular hole, the hole is readily identified visually, either by eye or by use of a machine vision system. Once the tester is configured, each hole in the subset should contain a probe, and no probes should be present in holes not contained in the subset. Once all the probes are configured, a final visual inspection of the tester is relatively simple, as the technician may simply look at the plate and ensure that each hole in the subset has a probe that extends through it, and that none of the probes extend through holes not in the subset.

The present embodiment has a circuit tester for testing for reliably and repeatedly testing circuit boards in a plurality of different circuit conditions comprising a first circuit board mounting plate; a probe plate aligned with said circuit board mounting plate having a first set of probes of predetermined length and a second set of shorter probes; an adjuster for moving said first plate and said probe plate toward and away from each other along a single axis from a first position wherein none of said probes contact said the circuit board on said mounting plate, to a second position wherein said first probes contact said circuit board and to a third position wherein said first and second probes contact said circuit board so that said circuit board may be tested under different conditions depending upon the probes in contact therewith.

A further embodiment has a method of testing a circuit board on a test bed having a first set of compressible probes and a second set of shorter probes, comprising the steps of: defining an axis of movement for the test bed being generally coaxial with said probes; enclosing said test bed in a first compressible enclosure, said enclosure being capable of moving along said axis to urge said circuit board into contact with at least some of said probes when in a compressed state; enclosing said test bed in a second compressible enclosure at least partly outside of said first enclosure, said second enclosure being capable of moving along said axis to urge said circuit board into contact with at least some of said probes; providing a vacuum source for selectively withdrawing air from said first and second enclosures thereby selectively drawing said first and second sets of probes into contact said circuit board.

DETAILED DESCRIPTION OF THE INVENTION

In a manufacturing environment for circuit boards, a final test will often be an electrical test, to ensure that each circuit board performs as required. Such tests are well-known in the industry, and may be performed by commercially available testers, such as Agilent Model 3070.

Figure 1:
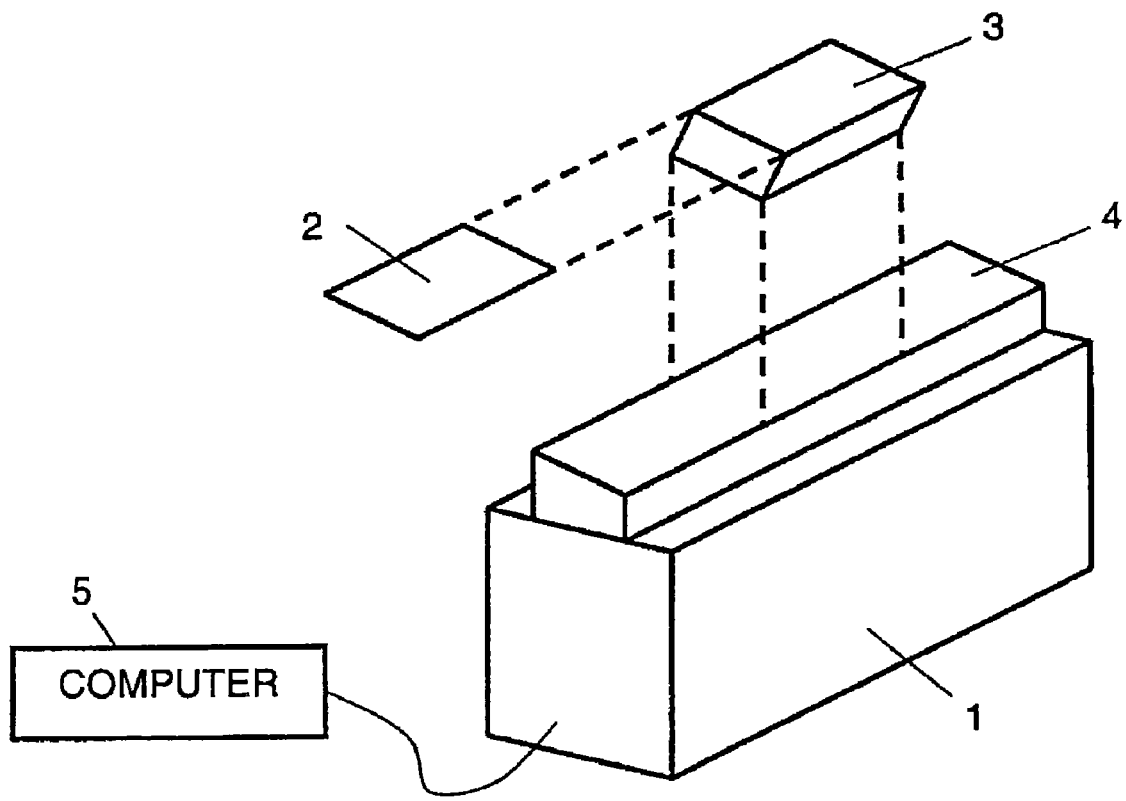
FIG. 1 illustrates a schematic of a circuit board tester.

A basic schematic of a circuit board tester 1 is shown in FIG. 1. A circuit board, often referred to as a unit under test (UUT) 2, is mounted on a fixture 3 for the duration of the test, which provides a rugged mechanical mount for the UUT as well as a mechanical interface with other components in the tester 1. The fixture 3 is positioned on a bed 4, so that various electrical probes may make contact with specific locations on the UUT 2 and perform the desired tests. The probes may apply and measure voltages or currents at various locations on the UUT 2, and are controlled mechanically and electrically by the tester 1. A computer 5 may control the tester 1 and may record data from the tests.

Figure 2:
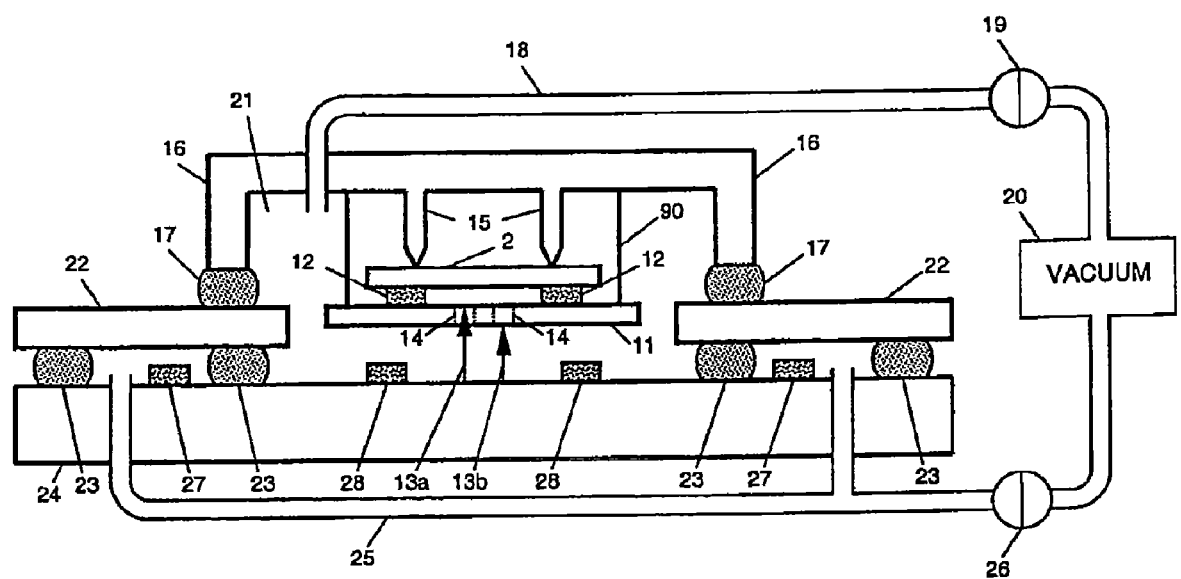
FIG. 2 illustrates a schematic of a dual-stage circuit board tester in "rest" position.

A more detailed view of the mechanical configuration is shown in FIG. 2. The UUT 2 is removably and rigidly attached to, and is spaced apart from, a support plate or mounting plate 11 via spacer elements 12. The electrical contacts on the UUT 2 that are to be tested face downward, and are accessible by probes 13a,b that extend through holes or apertures 14 contained in the support plate 11. The support plate 11 also has regions that are devoid of holes or apertures 14. Fingers 15, attached to a vacuum box 16, hold the UUT 2 on the side opposite the support plate 11. The support plate 11 may be fastened to the vacuum box 16 by supports 90 (omitted for clarity from FIGS. 3 and 4). The vacuum box 16 rests on a set of second seals 17, and may be evacuated through a vacuum connection 18, connected via a second valve 19 to a vacuum system 20. Initially, during the loading and unloading of parts, and before any tests are performed, the second valve 19 is closed (as drawn in FIG. 1), and the volume 21 inside the vacuum box 16 is at atmospheric pressure. The second seals 17 may contain springs (not shown) or may contain a compressible material, such as a foam, so that the second seals 17 compress when the vacuum box 16 is evacuated, and retain a generally expanded shape when the vacuum box 16 is at atmospheric pressure.

The second seals 17 rely on atmospheric pressure to change shape; when the second valve 19 is opened, the volume 21 is connected with a vacuum system 20 that pumps it down to a pressure below atmospheric pressure. The difference between atmospheric pressure and the pressure inside the vacuum box 16 is applied uniformly across the area of the vacuum box 16 by the atmosphere, and a net force is applied downward on the vacuum box 16, compressing the second seals 17.

With respect to FIG. 1, the fixture 3 includes the vacuum box 16, the second seals 17, the fingers 15, the UUT 2, the spacer elements 12, and the support plate 11. The fixture is connected to the vacuum system 20 by the vacuum connection 18. The vacuum connection 18 is typically a hose or pipe, and generally does not offer any mechanical support for the fixture 3.

The second seals 17 rest upon a series of top plates 22. The top plates 22 are permanently attached to a probe plate 24 through a series of first seals 23. The first seals 23 may be similar in composition to the second seals 17, retaining a generally expanded shape in atmospheric pressure, and compressing under the influence of a vacuum.

The probe plate 24 contains a series of vacuum connections 25, connected via a first valve 26 to the vacuum system 20. When the first valve 26 is opened, the vacuum system 20 evacuates a volume, or series of volumes, bounded by the probe plate 24, the top plates 22, and the first seals 23. When these volumes are pumped down to a pressure less than atmospheric pressure, the first seals 23 compress under the influence of negative atmospheric pressure, as described above.

A series of first hard stops 27 is located between the first probe plate 24 and the top plates 22, typically attached to the probe plate 24. When the first valve 26 is opened, the first seals 23 compress until the top plates 22 contact the first hard stops 27. Because an accurate spacing is required between the probe plate 24 and the top plates 22, this spacing is generally fixed by the thickness of the first hard stops 27.

The probe plate 24 also contains a series of second hard stops 28, located between the probe plate 24 and the support plate 11. Although the second hard stops 28 are generally similar to the first hard stops 27 in composition, they likewise may be fabricated from various materials. The sizes of both first hard stops 27 and second hard stops 28 are determined by the dimensions of the UUT 2 and the specific tests required. Thus the hard stops on all plates are of predetermined dimensions which provide a predicable stop point to the UUT at the various test positions. When both the first valve 19 and second valve 26 are open, both the first seals 23 and second seals 17 compress until the support plate 11 contacts the second hard stops 28. Note that any or all of the hard stops may be built into the probe plate 24 itself, such as using a series of grooves, stand-offs or depressions.

With respect to FIG. 1, the bed 4 includes the top plates 22, the first seals 23, the probe plate 24, the first hard stops 27, the second hard stops 28, and the probes 13a,b. The bed 4 is connected to the vacuum system 20 by the vacuum connection 25, typically a hose or pipe.

Although the probes 13a, b are drawn in FIG. 2 as attached to the probe plate 24, the tall probe 13a being appropriately spring-loaded so as to maintain physical and electric contact with the UUT 2 without damaging the UUT 2, the probes 13a,b may in actuality be attached to a mechanism beneath the probe plate 24, and the probes may extend through holes (not shown) in the probe plate 24. Although only two probes 13a,b are shown in FIG. 2, it will be appreciated that the tester 1 may contain many more probes 13a,b, perhaps several dozen or more.

FIG. 2 shows the system in a "rest" position, which occurs both before and after any tests are performed. The first valve 26 and the second valve 19 are both closed, and the entire system is generally at atmospheric pressure. Both the first seals 23 and the second seals 17 are extended. The top plates 22 are spaced apart from the first hard stops 27, and the support plate 11 is spaced apart from the second hard stops 28. Most importantly, all of the probes 13a,b are spaced apart from the UUT 2 when the system is in a "rest" position.

Figure 3:
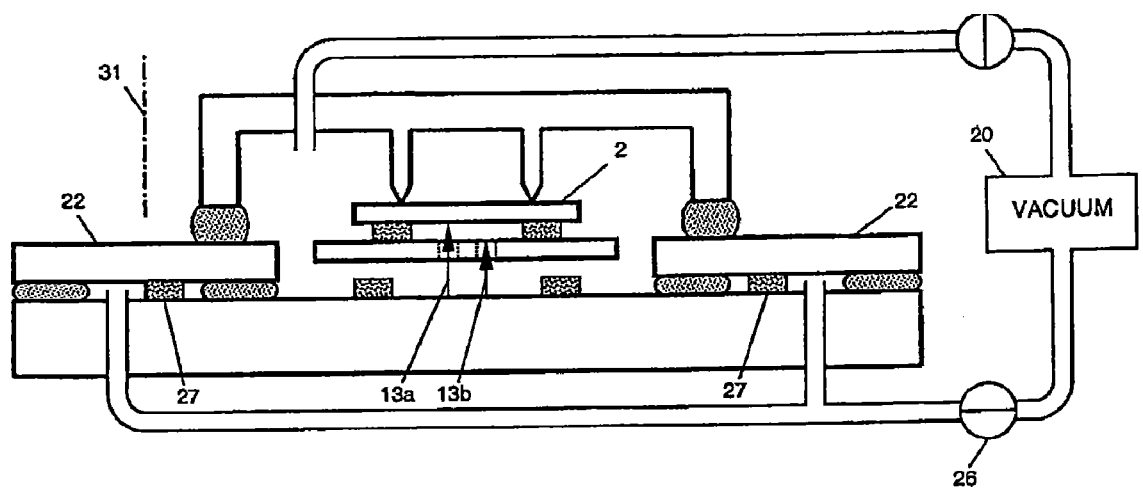
FIG. 3 illustrates a schematic of a dual-stage circuit board tester in "functional test" position.

FIG. 3 shows the system in a "functional test" position, in which the first valve 26 is open. The first seals 23 are compressed under the influence of the vacuum 20, as described above. (Note that the second seals are not compressed.) The top plates 22 are brought into contact with the first hard stops 27. Most importantly, the tall probe 13a is brought into contact with the UUT 2, while the short probe 13b is spaced apart from the UUT 2. Although only two probes 13a,b are drawn in FIG. 3, it will be appreciated that a plurality of both tall and short probes are used in the device, and that in the "functional test" position, all of the tall probes are in physical and electrical contact with the UUT 2, and all of the short probes are spaced apart from the UUT 2.

Figure 4:
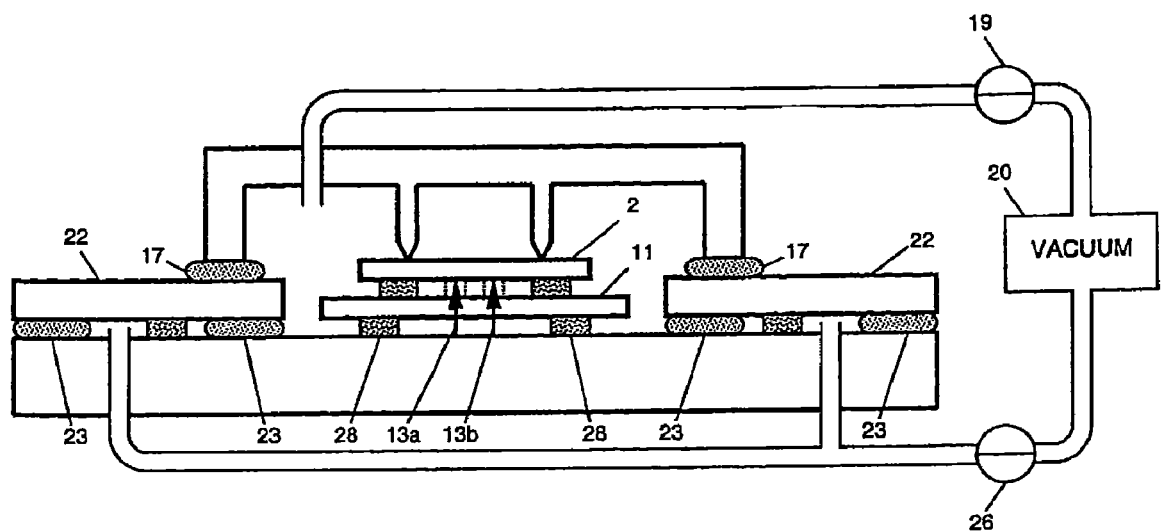
FIG. 4 illustrates a schematic of a dual-stage circuit board tester in "in-circuit test" position.

FIG. 4 shows the system in an "in-circuit test" position, in which both the first valve 26 and the second valve 19 are open. Both the first seals 23 and the second seals 17 are compressed under the influence of the vacuum 20, as described above. The support plate 11 is brought into contact with the second hard stops 28. The short probe 13b is brought into contact with the UUT 2. In addition, the long probe 13a, which is appropriately spring-loaded, remains in contact with the UUT 2. Although only two probes 13a,b are drawn in FIG. 4, it will be appreciated that a plurality of both tall and short probes are used in the device, and that in the "in-circuit test" position, both the tall and short probes are in physical and electrical contact with the UUT 2.

Generally, after a UUT 2 is removably attached to the support plate 11, a functional test is performed (FIG. 3—note that one valve is open and one is closed, and that only the tall probes are in contact with the UUT), followed by an in-circuit test (FIG. 4—note that both valves are open, and that both the tall and short probes are in contact with the UUT). The UUT 2 is then detached from the support plate 11 and replaced with another unit to be tested. It will be understood that this sequence of events is a typical embodiment, and may be altered as necessary. Note also that the "functional test", shown in FIG. 3, may be performed equally well with either valve open, and the other valve closed.

While the actuating mechanism of FIGS. 2-4 is shown as a vacuum system, it will be appreciated that other methods, such as positive or change in pressure (i.e., the opposite of a vacuum) or non-pressure methods could achieve similar results. For example, a solenoid system could substitute for the vacuum without departing from the spirit of the invention. Likewise, a screw drive, or equivalent mechanical system for raising and lowering the plates would suffice.

Regardless of the type of actuating mechanism used, the actuated motion of the plates is preferably oriented largely parallel to the probes, so that the probes remain aligned with their corresponding test points. The actuated motions of the two stages are preferably substantially coaxial or collinear. In order to ensure coaxial motion, the two stages may slide along common alignment pins or guide pins (not shown), which may preferably be located outside the vacuum chambers, and may preferably constrain the relative motion of the two stages colinearly. Preferably, the common alignment pins lie generally parallel to the probes, along the direction 31 in FIG. 3. Preferably, the guide pins may be located near the corners of the plates in order to provide optimal stability during motion.

As discussed earlier, the probe plate 24 may contain holes, through which the probes pass. The probe plate is constructed as part of the tester, and is generally not removed or replaced between tests of individual parts. In general, certain holes in the probe plate are marked in some manner before the tester is configured, in order to show which subset of the holes should receive probes.

Figure 5:
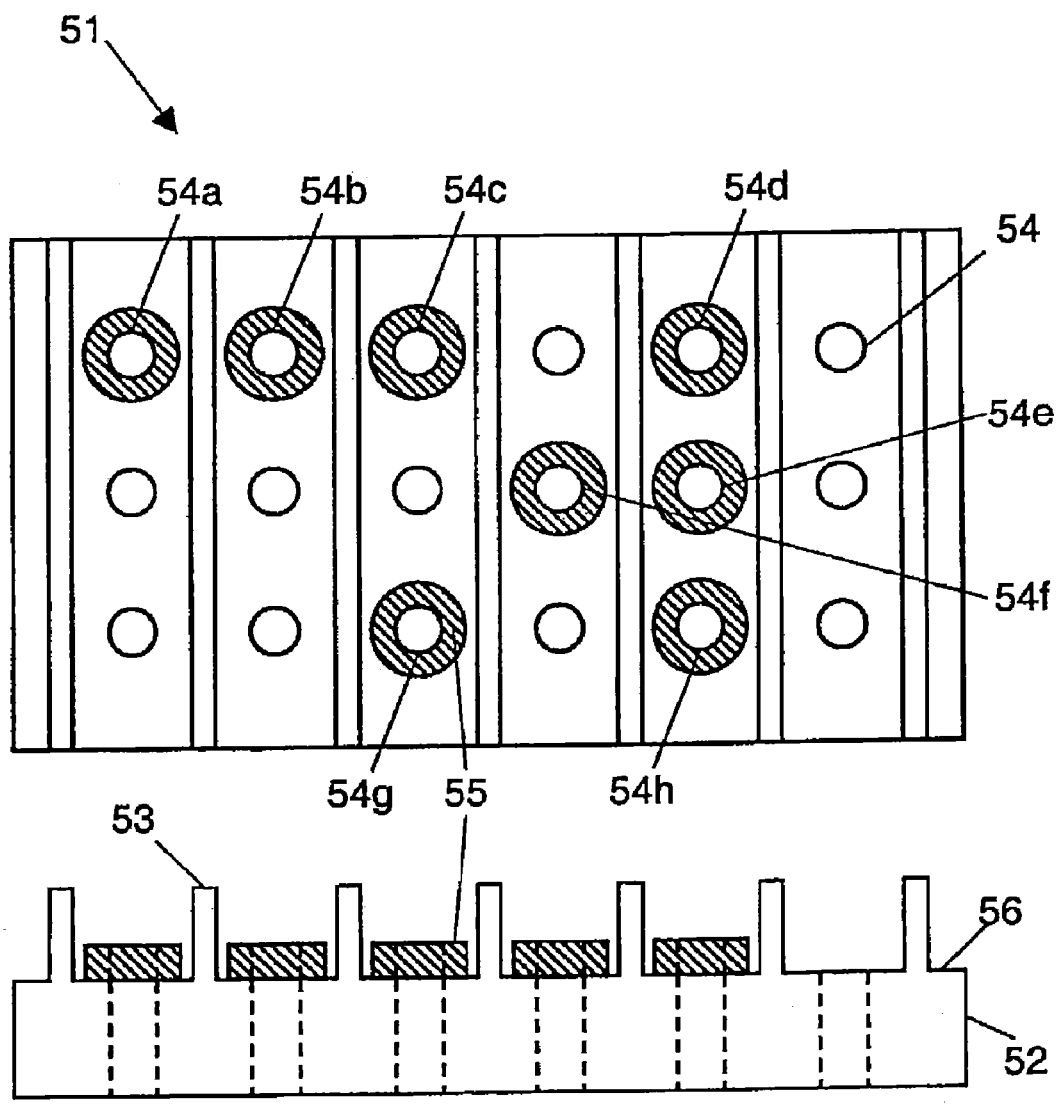
FIG. 5 is a schematic of a prior art grooved plate with a subset of holes identified manually.

FIG. 5 shows a prior art probe plate (or simply "plate") 51, which contains a first face 56 and a plurality of holes 54. The holes 54 are drawn in a rectangular array, but it will be appreciated that the holes 54 may be configured arbitrarily on the plate 51. As used in a circuit board tester, the plate 51 is typically built into the tester, and typically provides a protective and alignment mechanical surface against which parts may be held during the test procedure. (Note that the hard stops 27 and 28 may be incorporated into the plate 51 itself as a series of protrusion 53.) A fixture that contains a circuit board under test may be placed rigidly in contact against the grooves 53 on the first face 56 of the plate 51, and a plurality of electrical probes access various points on the circuit board through various holes 54 in the plate 51. During the testing procedure, the probes apply and measure various voltages and currents at specific locations in a circuit board under test, generally to ensure that the circuit performs adequately. Typically, a single probe corresponds to a single hole 54 in the plate 51.

Prior to usage of the tester, the various electrical probes must be configured to test specific locations in a particular circuit. The probe locations are typically generated at the CAD (computer assisted drafting) level, usually by the same tools that lay out the components on the circuit boards. The probe locations may be documented in CAD drawings and communicated to a technician that configures the probes manually, or may be encoded and communicated electronically to an automated device that configures the probes.

Once the tester probes are properly configured and the plate 51 is attached to the tester, a subset 54a-54h of the holes 54 in the plate 51 will receive probes during operation of the tester. The remainder of the holes 54 that are not in the subset 54a-54h do not receive probes during operation of the tester. It will be appreciated that the number and locations of the holes in subset 54a-54h depend on the circuit under test, and are relatively unimportant for the present invention.

The final step in the manufacturing process for the prior art plate 51 is a manual identification of the subset 54a-54h of holes 54 that receive probes. The user identifies the subset 54a-54h of holes 54, produces a CAD drawing or file describing the locations of the subset 54a-54h, and sends the drawing or file to the plate manufacturer. The manufacturer of the prior art plate 51 then marks each hole 54 in the subset 54a-54h by hand, typically by painting or marking a small area around each hole 54 in the subset 54a-54h on the first face 56. The paint or ink 55 is preferably in high contrast to the unpainted color of the bare plate 52. For example, if the bare plate 52 is a dark-colored polycarbonate material, then the paint or ink 55 should be a light color, so that the marked holes are readily visibly detected, by eye or by a machine vision system. Although the marked areas surrounding each hole 54 in the subset 54a-54h are drawn as circular in FIG. 1, it will be appreciated that the markings may be of any shape or pattern, as long as each marking is readily identifiable with exactly one hole 54 in the subset 54a-54h.

A severe drawback to the manual marking system of the prior art plate 51 is that it is very labor-intensive, and therefore very expensive. For a plate 51 that requires dozens of markings, in an array with hundreds of holes, the marking procedure can be quite significant, and in some cases, can be the greatest expense in producing the plates 51.

Although one may be tempted to fabricate a new plate for each circuit under test, with holes only where probes are placed, this would be expensive and largely impractical. The prior art plate 51 is generally molded from a plastic material, such as polycarbonate, and has its holes incorporated into the mold itself. A custom prior art plate 51 molded in this manner, with holes only where required by the user, would require a custom mold for each user, which is impractically expensive. Additionally, the drilling of holes in a blank plate, while possible, is also more expensive than the prior art technique of manually marking the holes. Accordingly, there is a need for a plate that has a large number of holes for flexibility, but has a way of inexpensively identifying a subset of the holes to simplify the final inspection of the tester.

Figure 6:
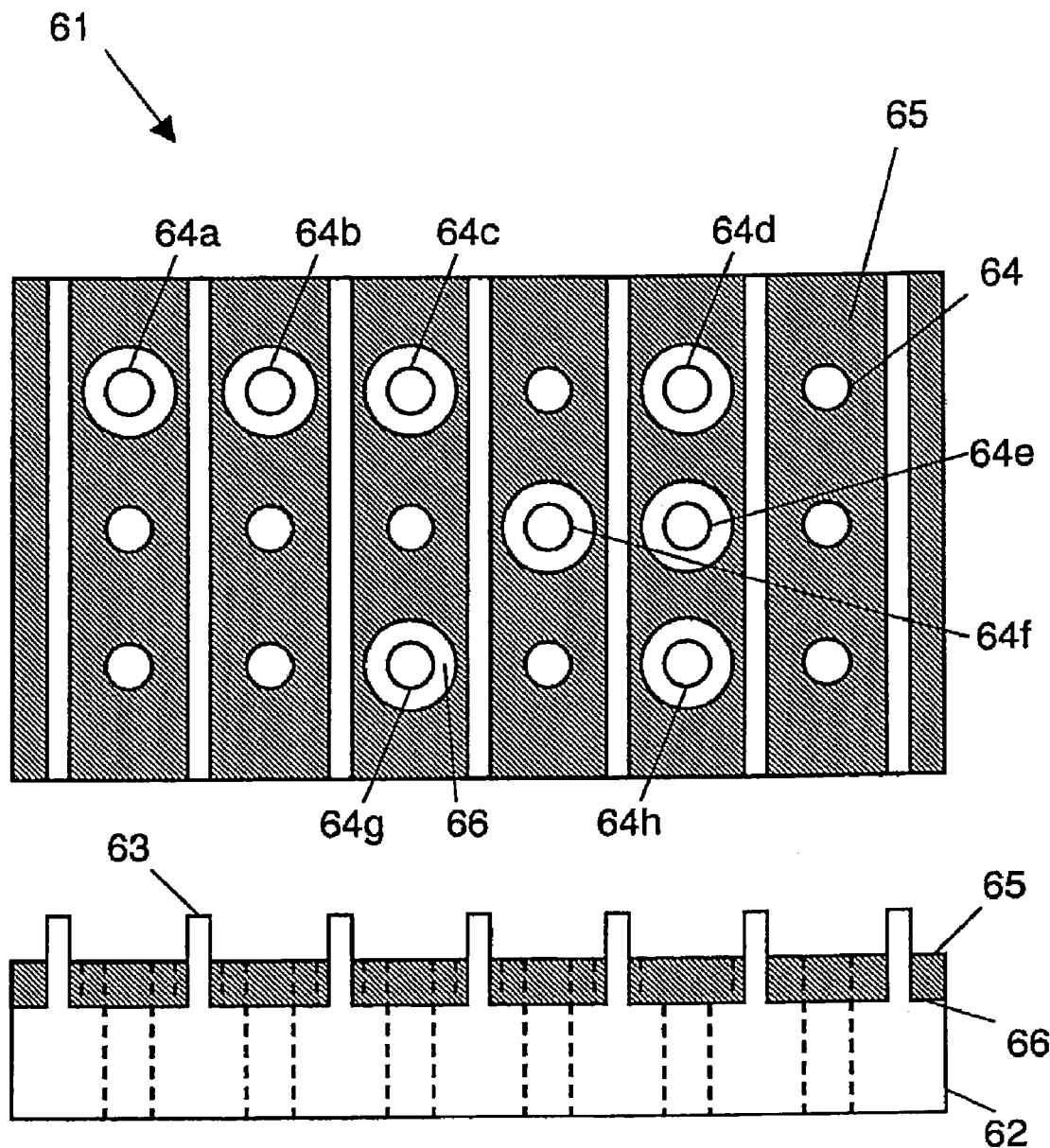
FIG. 6 is a schematic of a grooved plate with a subset of holes identified according to an embodiment of the present invention.

FIG. 6 shows a present embodiment of a plate 61. A coating 65 is applied to a first face 66 of an uncoated plate 62, preferably in the area between the protrusion 63. The protrusion 63 may be coated as well, but at the risk of flaking or peeling of the coating 65. The uncoated plate 62 contains a plurality of holes 64, and the coating 65 does not fill in the holes 64. The coating 65 may be a paint, a two-part epoxy, or an other opaque coating, preferably of a color of a high contrast with the color of the uncoated plate 62. Preferably, the coating 65 is not electrically conductive. For example, if the uncoated plate 62 is dark-colored, a suitable coating 65 may be commercially available "Polane T-White" paint.

Note that it is generally difficult to fabricate a coating 65 that adheres well to a plastic uncoated plate 62. In preliminary tests, it was found that standard paints did not adhere well to the polycarbonate plate. Often, the standard paints would chip during the hole-identification process so that more than one hole was exposed, effectively rendering the plate useless. These issues were resolved by finding a suitable overcoat material that ensures proper bonding with the uncoated plate.

Note also that the coating 65 may be formed in layers, in order to optimize both adhesion and color contrast with the uncoated plate material. For instance, a layer in closest proximity to the plate may have desirable adhesion properties, and a layer farthest away from the plate may have desirable color characteristics. It will be understood by those skilled in the art that any suitable material, combination of materials, or combination in layers may be used, without limiting the scope of the invention.

In a subset 64a-64h of holes 64, the coating 65 has been removed in the region around each hole 64 in the subset 64a-64h, exposing the first face 66 underneath. Because the coating 65 contrasts with the color of the uncoated plate 62, each hole 64 in the subset 64a-64h is readily visually identifiable, whether by eye or by a camera in a machine vision system. The coating 65 may be ablated by appropriate methods, such as scraping, drilling, chipping, peeling, punching, grinding, and the like.

Preferably, the removal of the coating around each hole 64 in the subset 64a-64h is performed by an automated tool, such as an automated drill that receives a set of subset 64-64h locations from a CAD file. The automated drill preferably uses a drill bit larger than the hole 64 diameter, and drills only enough material to completely remove the coating 65, without substantially drilling through the first face 66. For example, if the coating 65 has a thickness of roughly 0.1 mm, then the drill may remove roughly 0.5 mm of material. The uncoated plate 62 may be substantially thicker than 0.5 mm. Note that drilling such shallow holes is an inexpensive procedure compared to drilling comparable through holes, and that very little waste material is produced. The hole may be countersunk, if convenient. Additionally, if the user decides to add another hole 64 to the subset 64a-64h, he may mark the added hole by hand, simply by turning a drill bit centered in the hole by hand and grinding for a few seconds; the coating 65 comes off readily.

It will be understood that the protrusion 63 on the plate 61 are not essential for the present embodiment. A similar coating 65 may be applied to an uncoated plate that has physical features other than grooves, such as posts, or has no physical features at all. The coating 65 may be applied to the regions between holes 64, so that when removed, the hole may be readily visibly identified by eye or by a machine vision system as part of the subset 64a-64f.

As used in a circuit board tester, the plate 61 of FIG. 6 would readily identify the subset 64a-64h of holes 64 that receive probes during operation. Because of the high contrast between the coating 65 and the color of the uncoated plate 62, the technician easily sees the exposed first face 66 in the regions around each hole 64 in the subset 64a-64h, and can then quickly complete the final inspection of the probe locations prior to operation. If the technician finds any holes 64 in the subset 64a-64h that are missing a probe, or finds a probe in a hole 64 that is not in the subset 64a-64h, he can take corrective actions. Because the entire subset 64a-64h is visible all at once to the technician, without the need for manually counting rows and columns, the efficiency of the inspection process is greatly improved.

We claim:

1. A method of identifying specific holes in a board interface guiding plate having a surface of first predetermined surface color, said plate intended to receive contact pins to pass through said specific holes, the method comprising:
    a) firmly adhering an indicator colorant of a second predetermined color to said surface at least surrounding each of said holes;
    b) removing the indicator colorant generally circumferentially around selected holes which are to be left populated or conversely unpopulated with pins, so that holes can be distinguished from each other;
    c) populating as a group either the selected or unselected holes with pins; and
    d) visually verifying that holes which are to be populated with pins are present in the appropriate holes and absent in all others as determined by the presence or absence of colorant.

2. The method of claim 1 wherein the indicator is a colorant and wherein the colorant is visually distinguishable by contrast from the predetermined surface color and wherein the step of removing said colorant is ablation.

3. The method of claim 1 wherein the indicator is a colorant and wherein the colorant is visually distinguishable by contrast from the predetermined surface color and wherein the step of removing said colorant is countersinking by drilling.

4. The method of claim 1 wherein the indicator is a colorant and wherein the colorant is visually distinguishable by contrast from the predetermined surface color and wherein the step of removing said colorant is lasering.

5. The method of claim 1 wherein the holes which have the colorant removed are populated with pins.

6. The method of claim 1 wherein the holes which do not have the colorant removed are populated with pins.

7. The method of claim 1 wherein the holes are drilled into the plate in a regular matrix of rows and columns.

8. A method of identifying specific holes in a non circuit board interface guiding plate having a surface of first predetermined surface color, said plate intended to receive contact pins to pass through specific holes, the method comprising:
    a) forming a plurality of holes in the interface plate to form a matrix of columns and rows of holes;
    b) overcoating said surface with a coating having a second predetermined surface color, said overcoating second color being different from said plate surface color;
    c) determining which of the holes in the matrix are to be identified for populating with said contact pins; and
    d) removing said overcoating around such holes as are determined to be populated; so that visual inspection of the plate will easily identify holes intended to be populated by the lack of overcoating adjacent said holes.

9. The method of claim 8 further including populating on the holes where the overcoating is removed.

10. The method of claim 8 further including populating on the holes where the overcoating is not removed.

11. The method of claim 8 wherein the overcoating is removed by countersink drilling of selected holes.

12. The method of claim 8 wherein the overcoating is removed by abating.

13. The method of claim 8 wherein the overcoating is removed by lasering.

14. A method of preparing a board interface guiding plate for using in a circuit testing device, said plate having a matrix of holes in rows and columns to be located in a circuit board testing device, some of the holes to be populated by probes which will extend through the holes and engage an electronic circuit board when the board and probes are brought together by the testing device, said plate having a surface of first predetermined surface color, said plate intended to receive contact pins in specific holes, the method comprising:

a) forming a plurality of holes in the interface plate to form a matrix of columns and rows of holes;

b) overcoating said surface with a coating having a second predetermined surface color, said overcoating second color being different from said plate surface color;

c) determining which of the holes in the matrix are to be identified for populating with said contact pins; and d) removing said overcoating around such holes as are determined to be populated; so that visual inspection of the plate will easily identify holes intended to be populated by the lack of overcoating adjacent said holes.

* * * * *